United States Patent
Zhou

(10) Patent No.: US 10,367,058 B2
(45) Date of Patent: Jul. 30, 2019

(54) CHANNEL STOP IMP FOR THE FINFET DEVICE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/728,184

(22) Filed: Oct. 9, 2017

(65) Prior Publication Data

US 2018/0122896 A1 May 3, 2018

(30) Foreign Application Priority Data

Oct. 31, 2016 (CN) .......................... 2016 1 0925896

(51) Int. Cl.
*H01L 21/324* (2006.01)
*H01L 29/06* (2006.01)
(Continued)

(52) U.S. Cl.
CPC .... *H01L 29/0638* (2013.01); *H01L 21/02164* (2013.01); *H01L 21/26513* (2013.01);
(Continued)

(58) Field of Classification Search
None
See application file for complete search history.

(56) References Cited

U.S. PATENT DOCUMENTS 9,087,860 B1   7/2015 Banghart et al.
9,245,885 B1   1/2016 Xie et al.
(Continued)

FOREIGN PATENT DOCUMENTS

CN    104752214    7/2015
JP    2002118255   4/2002
JP    2016015400   1/2016

OTHER PUBLICATIONS

European Patent Application No. 7198882.7, Extended European Search Report dated Apr. 10, 2018, 8 pages.
(Continued)

*Primary Examiner* — Bradley Smith
(74) *Attorney, Agent, or Firm* — Kilpatrick Townsend & Stockton LLP

(57) ABSTRACT

A method for manufacturing a semiconductor device includes providing a substrate structure including a substrate, a semiconductor fin on the substrate, and an isolation region on opposite sides of the semiconductor fin, the isolation region having an upper surface substantially flush with an upper surface of the at least one semiconductor fin. The method also includes implanting ions into the substrate structure to form a doped region in the semiconductor fin and in the isolation region, etching back the isolation region to expose a portion of the semiconductor fin, and performing an annealing process to activate the implanted ions in the doped region. Because the annealing is performed after the etching back of the isolation region, a portion of the implanted ions diffuses out of the isolation region and the (Continued)

fin, thereby reducing ion diffusion into the channel region and improving the device performance.

19 Claims, 6 Drawing Sheets

(51) Int. Cl.
    *H01L 21/02*     (2006.01)
    *H01L 21/265*     (2006.01)
    *H01L 21/3065*     (2006.01)
    *H01L 21/308*     (2006.01)
    *H01L 21/3105*     (2006.01)
    *H01L 21/311*     (2006.01)
    *H01L 21/762*     (2006.01)
    *H01L 21/8234*     (2006.01)
    *H01L 29/167*     (2006.01)
    *H01L 29/66*     (2006.01)

(52) U.S. Cl.
    CPC ...... *H01L 21/3065* (2013.01); *H01L 21/3081* (2013.01); *H01L 21/31055* (2013.01); *H01L 21/31111* (2013.01); *H01L 21/324* (2013.01); *H01L 21/76224* (2013.01); *H01L 21/823431* (2013.01); *H01L 21/823481* (2013.01); *H01L 29/167* (2013.01); *H01L 29/66803* (2013.01)

(56) References Cited

U.S. PATENT DOCUMENTS

| | | | |
|---|---|---|---|
| 2013/0043563 A1* | 2/2013 | Nakazawa | H01L 29/66795 257/607 |
| 2013/0095626 A1 | 4/2013 | Sasaki | |
| 2015/0069474 A1* | 3/2015 | Ching | H01L 29/7842 257/288 |
| 2016/0093741 A1 | 3/2016 | Yang et al. | |
| 2017/0069539 A1* | 3/2017 | Li | H01L 21/823431 |

OTHER PUBLICATIONS

Takahashi et al., FinFETs with both large body factor and high drive-current, IEEE, Semiconductor Device Research Symposium, Dec. 12-14, 2007, 2 pages.

* cited by examiner

CHANNEL STOP IMP FOR THE FINFET DEVICE

CROSS-REFERENCES TO RELATED APPLICATIONS

The present application claims priority to Chinese patent application No. 201610925896.3, filed with the State Intellectual Property Office of People's Republic of China on Oct. 31, 2016, the content of which is incorporated herein by reference in its entirety.

FIELD OF THE DISCLOSURE

The present disclosure relates to the field of semiconductor technology, and more particularly to a method for manufacturing a fin-type field effect transistor device having reduced dopants diffused into the channel region when an annealing process is performed on the channel stop layer.

BACKGROUND OF THE INVENTION

As the feature size of metal oxide semiconductor field effect transistor (MOSFET) devices continues to decrease, the short channel effect becomes a critical issue in the performance of MOSFET devices. A Fin Field Effect Transistor (FinFET) device has good gate control capability and can effectively inhibit the short channel effect. Thus, FinFET devices are generally used in the design of smaller-sized semiconductor components.

However, semiconductor devices tend to be more susceptible to the punch through effect with reduced feature sizes. In order to suppress the punch through effect, a channel stop ion implantation can be performed at the bottom of the fin. However, the present inventor discovered that dopants will easily diffuse into the channel region disposed above when an annealing process is performed after the channel stop ion implantation, thereby affecting the performance of the device.

BRIEF SUMMARY OF THE INVENTION

The present disclosure describes a manufacturing method that can effectively reduce the diffusion of a dopant into the channel region after a channel stop ion implantation.

According to the disclosure, a method for manufacturing a semiconductor device is provided. The method includes providing a substrate structure including a substrate, at least one semiconductor fin on the substrate, and an isolation region on opposite sides of the at least one semiconductor fin, the isolation region having an upper surface substantially flush with an upper surface of the at least one semiconductor fin; implanting ions into the substrate structure to form a doped region in the at least one semiconductor fin and in the isolation region; etching back the isolation region to expose a portion of the at least one semiconductor fin; and performing an annealing process to activate the implanted ions in the doped region.

In one embodiment, providing the substrate structure may include providing an initial substrate; forming a patterned hardmask on the initial substrate; etching the initial substrate using the patterned hardmask as a mask to form the substrate, the at least one semiconductor fin, and a recess on the opposite sides of the at least one semiconductor fin; depositing an isolation material filing the recess and covering the hardmask; planarizing the isolation material in the recess so that the upper surface of isolation material is substantially flush with the upper surface of the hardmask; etching back the planarized isolation material to expose a side surface of the hardmask; and removing the hardmask to form the substrate structure.

In one embodiment, the method may further include, prior to depositing the isolation material, forming a liner layer on the substrate and on the at least one semiconductor fin.

In one embodiment, etching back the planarized isolation material includes removing a portion of the isolation material so that a remaining portion of the isolation material forms the isolation region; and removing an exposed portion of the liner layer to expose a portion of the at least one semiconductor fin.

In one embodiment, the etched-back isolation region has an upper surface higher than an upper surface of the doped region.

In one embodiment, the method may further include, prior to implanting ions into the substrate structure, forming a silicon oxide layer on the substrate structure.

In one embodiment, the at least one semiconductor fin may include a plurality of semiconductor fins.

In one embodiment, implanting ions into the substrate structure includes a p-type ion implantation process. The implanted ions include boron ions or boron difluoride ions.

In one embodiment, implanting ions into the substrate structure comprises an n-type ion implantation process. The implanted ions include arsenic ions or phosphorus ions.

In one embodiment, the substrate includes a well region having a same conductivity type as the doped region, and a dopant concentration of the well region is less than a dopant concentration of the doped region.

The following detailed description together with the accompanying drawings will provide a better understanding of the nature and advantages of the present disclosure.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
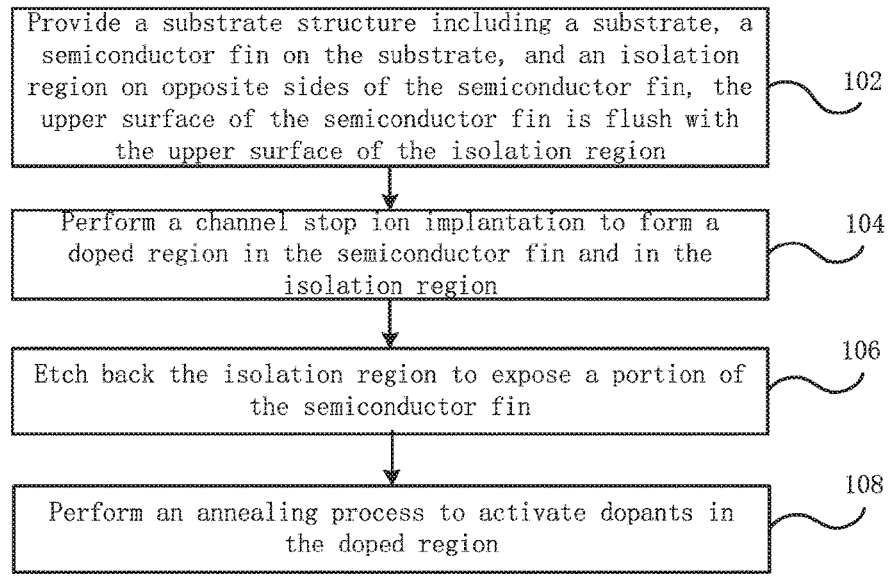
FIG. 1 is a flowchart of a method for manufacturing a semiconductor device according to one embodiment of the present invention.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that, this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It is noted that the reference numerals and letters denote similar items in the accompanying drawings. Thus, once an item is defined or illustrated in a drawing, it will not be further described in subsequent drawings.

FIG. 1 is a flowchart of a method for manufacturing a semiconductor device according to an embodiment of the present disclosure. Referring to FIG. 1, the method may include providing a substrate structure in step 102.

Figure 2:
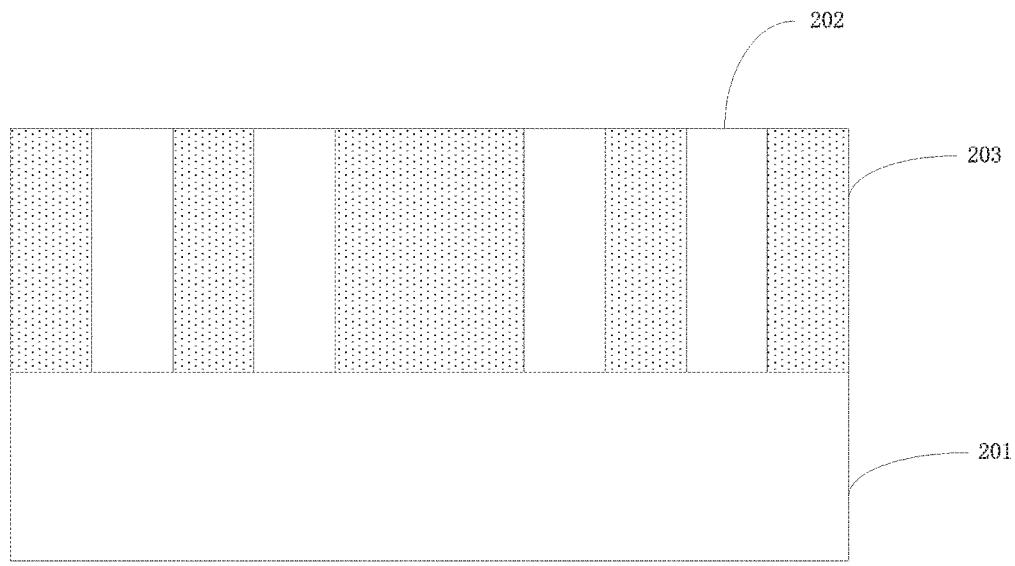
FIG. 2 is a cross-sectional view illustrating a substrate structure according to one embodiment of the present invention.

FIG. 2 is a cross-sectional view illustrating a substrate structure according to one embodiment of the present invention. Referring to FIG. 2, the substrate structure includes a substrate 201, one or more semiconductor fins 202 on substrate 201, and an isolation region 203 disposed on opposite sides of semiconductor fins 202. Semiconductor fins 202 each have an upper surface that is substantially flush with the upper surface of isolation region 203.

As used herein, the term "substantially flush" is synonymous with "substantially coplanar" and means that the top surface of the semiconductor fins and the top surface of the isolation region are coplanar within the limits of the process variation.

FIGS. 3A through 3F are cross-sectional views illustrating intermediate stages in the process of forming the substrate structure of FIG. 2 according to one embodiment of the present invention.

Figure 3A:
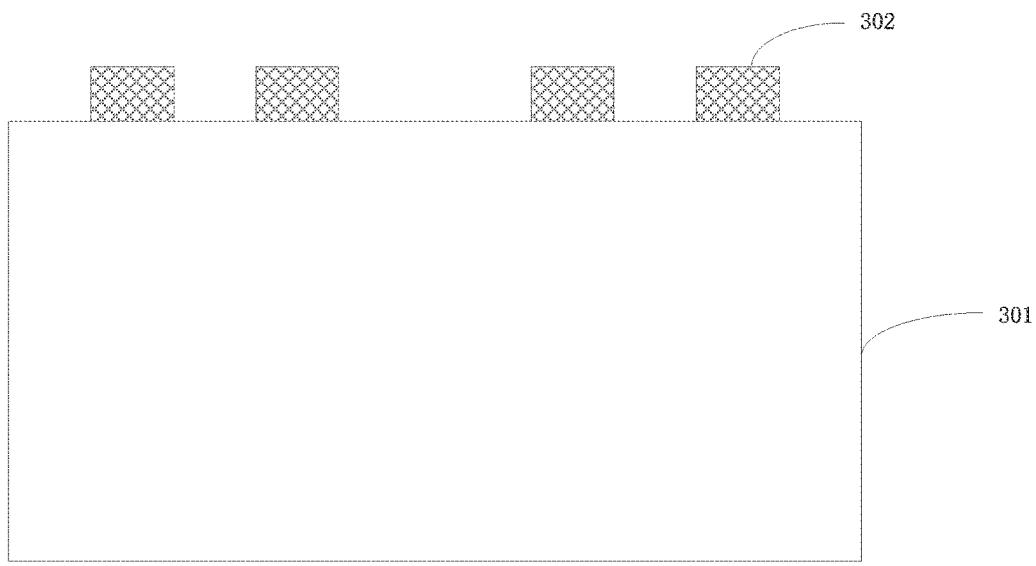
FIGS. 3A through 3F are cross-sectional views illustrating intermediate stages in the process of forming the substrate structure of FIG. 2 according to one embodiment of the present invention.

Referring to FIG. 3A, an initial substrate 301 is provided. A patterned hardmask 302 is formed on initial substrate 301. Initial substrate 301 may be, for example, silicon (Si), germanium (Ge), other semiconductor elements, gallium arsenide (GaAs), or other compound semiconductors. Hardmask 302 may be, for example, silicon nitride, silicon oxide, silicon oxynitride, and the like. However, the present disclosure is not limited thereto.

Figure 3B:
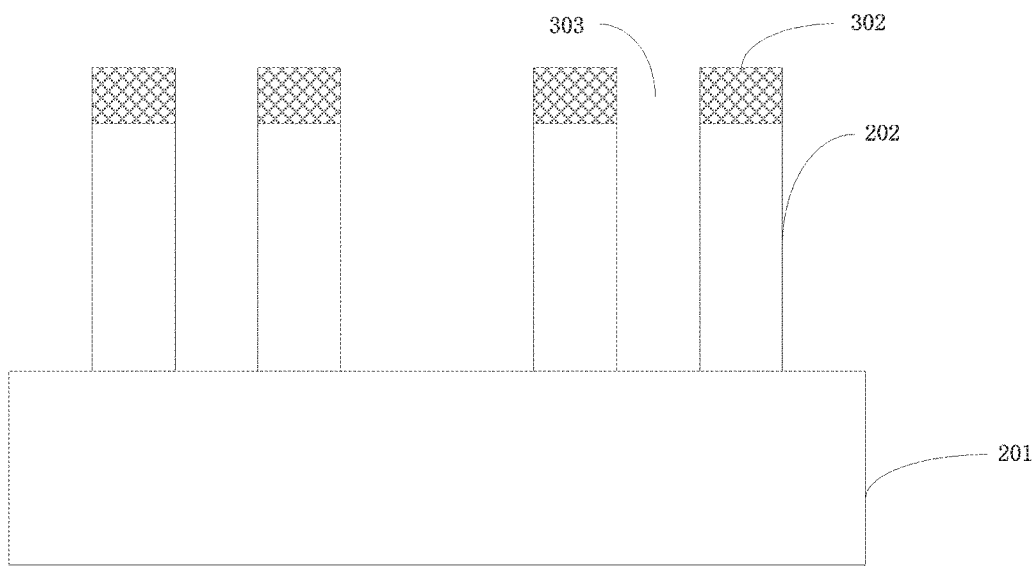

Referring to FIG. 3B, an etch process (e.g., dry etch) is performed on initial substrate 301 using hardmask 302 as a mask to form a substrate 201, semiconductor fins 202 on substrate 201, and a recess 303 on opposite sides of semiconductor fins 202. It is noted that, although FIG. 3B shows as having a solid line distinguishably separating semiconductor fins 202 and substrate 201, both the semiconductor fins and the substrate are formed from initial substrate 201. In other embodiments, substrate 201 and semiconductor fins 202 may also be formed using other process techniques.

Figure 3C:
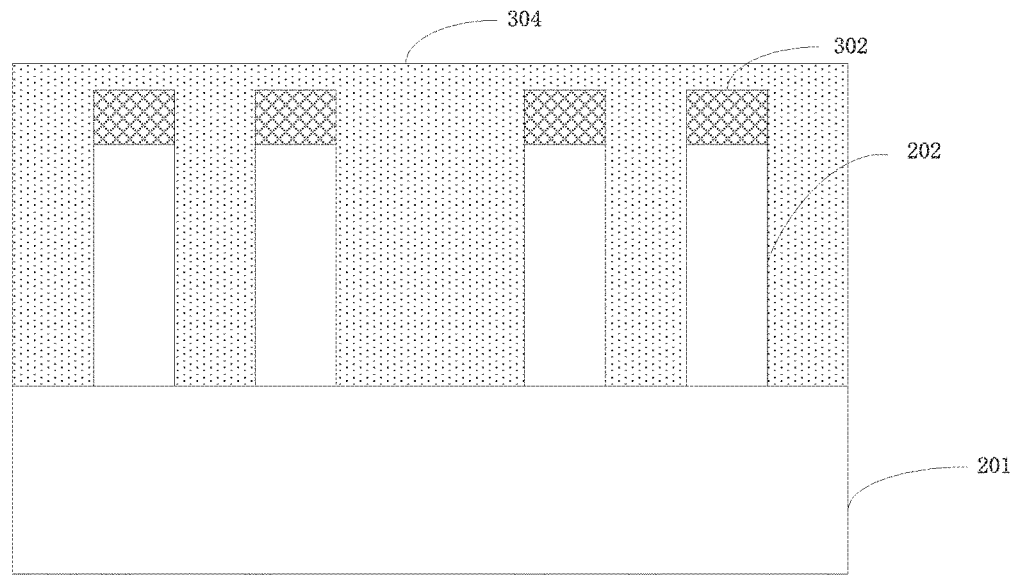

Referring to FIG. 3C, an isolation material 304 is deposited filling recess 303 and covering hardmask 302. For example, isolation material 304 (e.g., a dielectric material layer) may be deposited using a chemical vapor deposition (CVD) process (e.g., a flowable chemical vapor deposition process) to fill recess 303 and cover each semiconductor fin 202 and hardmask 302. In one embodiment, prior to depositing isolation material 304, a liner layer (not shown) may also be formed on the surface of substrate 201 and on the surface of semiconductor fins 202. The liner layer may be formed by thermal oxidation to form a silicon oxide layer. The liner layer may repair surface damages caused to semiconductor fins 202 when an etch process is performed on initial substrate 301. A portion of the liner layer on the surface of semiconductor fins 202 may be removed when a subsequent back etch process is performed on the isolation material.

Figure 3D:
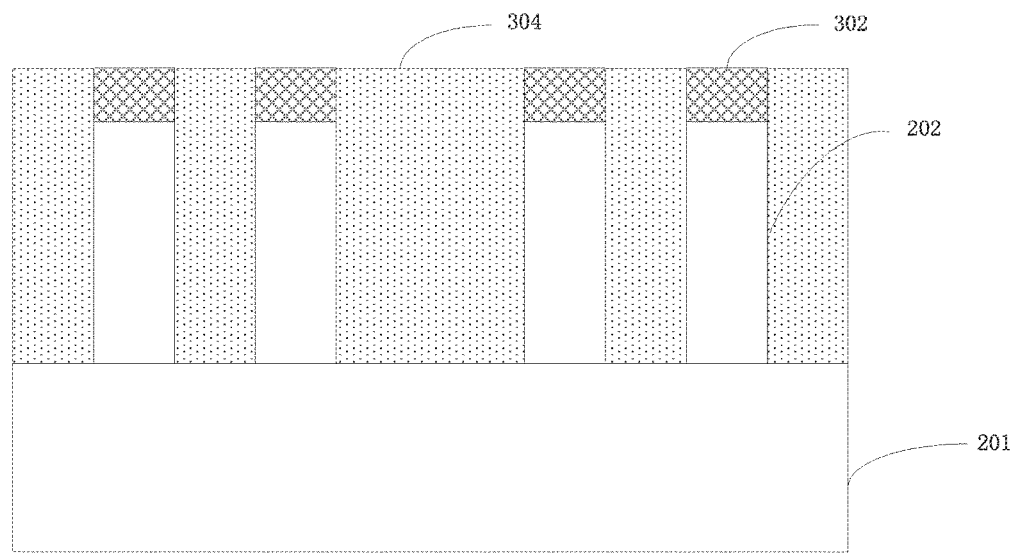

Referring to FIG. 3D, a planarization (e.g., chemical mechanical polishing) process is performed on isolation material 304, so that the upper surface of remaining isolation material 304 is substantially flush with the upper surface of hardmask 302.

Figure 3E:
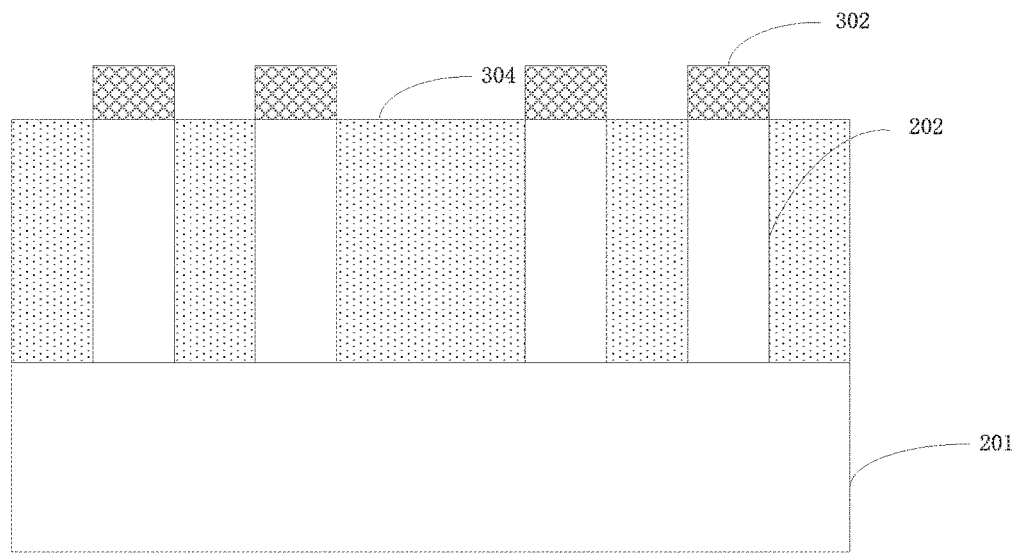

Referring to FIG. 3E, a portion of remaining isolation material 304 is etched back to expose side surfaces of hardmask 302.

Figure 3F:
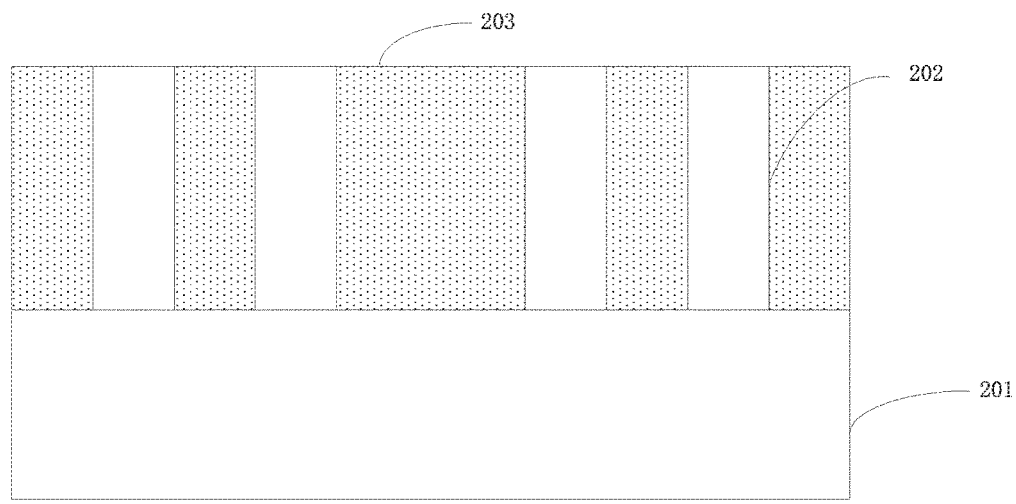

Referring to FIG. 3F, hardmask 302 is removed using, for example, a dry etch process, to form the substrate structure. A remaining portion of isolation material 304 forms isolation region 203.

Those of skill in the art will appreciate that other processes may also be used to form the above-described substrate structure.

Figure 4:
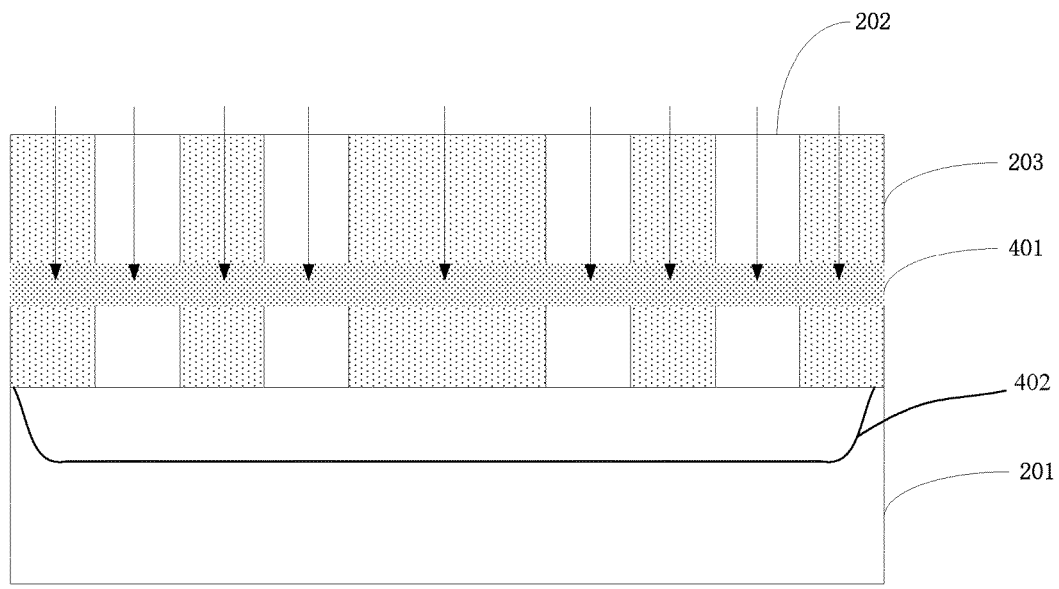
FIG. 4 is a cross-sectional view illustrating an intermediate stage of a method for manufacturing a semiconductor device according to one embodiment of the present invention.

Referring back to FIG. 1, in step 104, a channel stop ion implantation is performed to form a doped region 401 in semiconductor fins 202 and isolation region 203, as shown in FIG. 4. In one embodiment, prior to performing the channel stop ion implantation, a silicon oxide layer (not shown) may be deposited on the substrate structure shown in FIG. 2 to reduce damage to semiconductor fins 202 and isolation region 203 caused by performing the channel stop ion implantation.

In one embodiment, dopants (ions) will be implanted into semiconductor fins 202 and isolation region 203 while performing the channel stop ion implantation, and a portion of dopants implanted in isolation region 203 may laterally diffuse into semiconductor fins 202, doped region 401 in semiconductor fins 202 may serve as a channel stop layer. For an n-channel metal oxide semiconductor (NMOS) device, an ion implantation of a p-type dopant may be performed into semiconductor fins 202 and isolation region 203 to form a first doped region. Illustratively, the implanted dopant of the p-type ion implantation may include boron ions or boron difluoride ions. For a p-channel metal oxide semiconductor (PMOS) device, an ion implantation of an n-type dopant may be performed into semiconductor fins 202 and isolation region 203 to form a second doped region. Illustratively, the implanted dopant of the n-type ion implantation may include arsenic ions or phosphorus ions. In addition, in the case where the semiconductor device includes both the NMOS device and the PMOS device, a p-type ion implantation may be performed onto semiconductor fins 202 and isolation region 203 in the NMOS device, and an n-type ion implantation may be performed onto semiconductor fins 202 and isolation region 203 in the PMOS device.

Further, in some embodiments, substrate 201 may include a well region 402 having the same conductivity type as the conductivity type of doped region 401. In one embodiment, the well region 402 has a dopant concentration that is less than the dopant concentration of doped region 401. For example, the well region 402 is a p-well, the p-well has a dopant concentration less than the dopant concentration of the first doped region.

Figure 5:
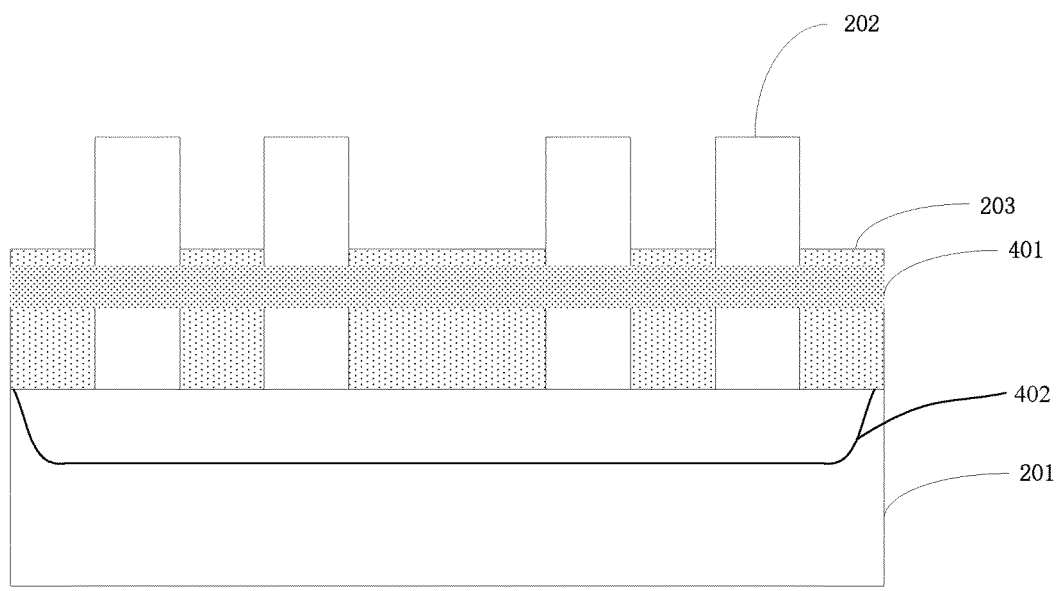
FIG. 5 is a cross-sectional view illustrating an intermediate stage of a method for manufacturing a semiconductor device according to one embodiment of the present invention.

Next, in step 106, an etch back process is performed on isolation region 203 to expose a portion of semiconductor fins 202, as shown in FIG. 5. In one embodiment, the upper surface of remaining isolation region 203 after performing the etch back process is higher than the upper surface of doped region 401. In the case where a liner layer is deposited on the surface of semiconductor fins 202, the step of etching back isolation region 203 may include firstly removing a portion of isolation region 203 to expose a portion of the liner layer, then removing the liner layer to expose a portion of semiconductor fins 202.

Figure 6:
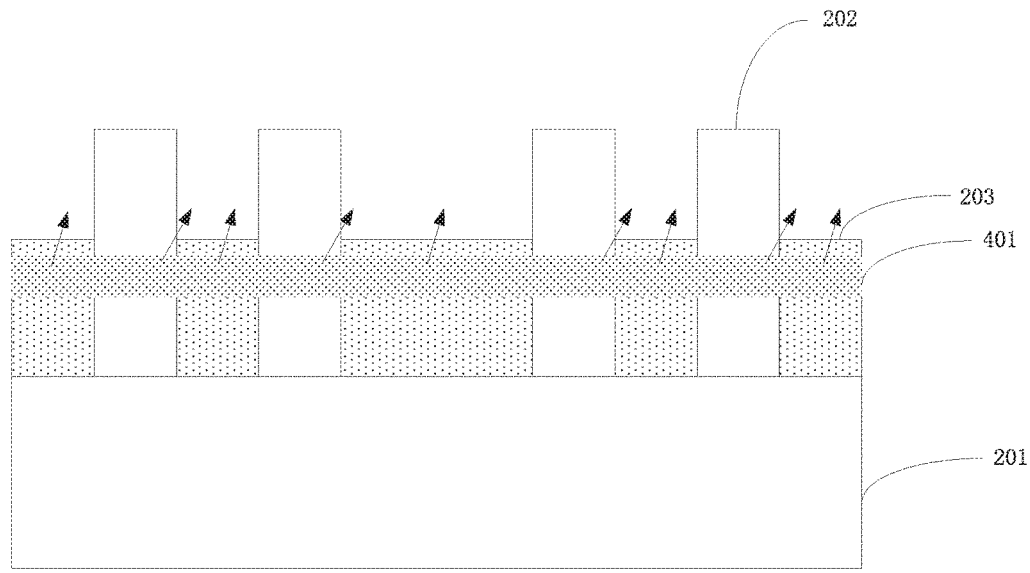
FIG. 6 is a cross-sectional view illustrating an intermediate stage of a method for manufacturing a semiconductor device according to one embodiment of the present invention.

Next, in step 108, an annealing process is performed to activate the dopant (ions) in doped region 401, as shown in FIG. 6.

Figure 7:
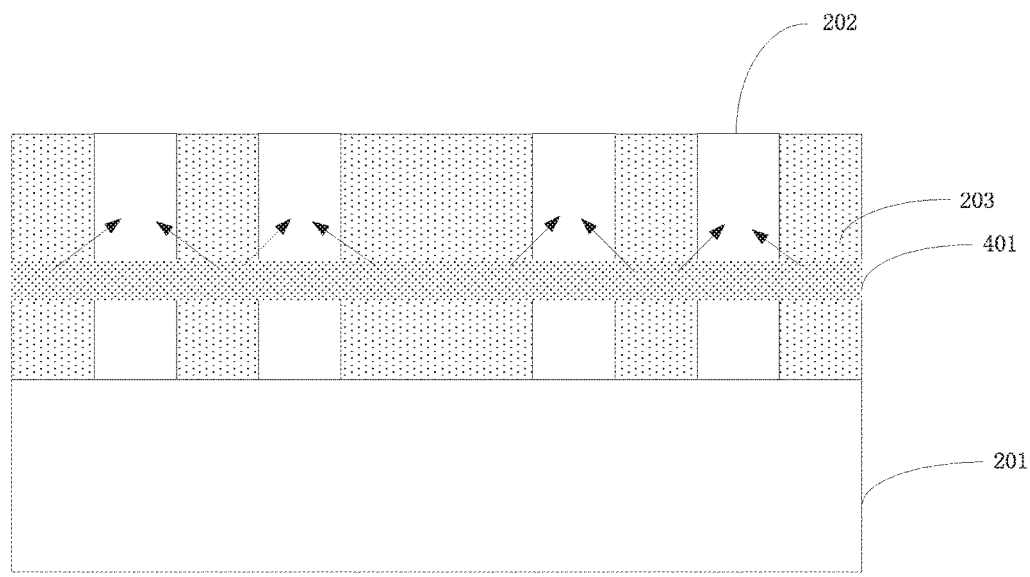
FIG. 7 is a cross-sectional view illustrating the diffusion of dopants after annealing according to the prior art.

FIG. 7 is a cross-sectional view illustrating the diffusion of dopants after annealing according to the prior art. Referring to FIG. 7, dopants in doped region 401 may diffuse into the channel region, thereby affecting the performance of the semiconductor device.

In accordance with the present disclosure, the manufacturing method may include performing an etch back process on isolation region 203 prior to performing an annealing process, so that a portion of the dopant can be diffuse to the outside of isolation region 203 and semiconductor fins 202, as shown in FIG. 6, thereby reducing the diffusion to the channel region and improving the performance of the semiconductor device.

Thereafter, subsequent processes may be performed, such as forming a gate, a source and a drain, and the like. Since subsequent processes are not the focus of the present disclosure, they will not be described herein for the sake of brevity.

Thus, embodiments of the present disclosure provide a detailed description of a method of manufacturing a semiconductor device. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a semiconductor device, the method comprising:
   providing a substrate structure including a substrate, at least one semiconductor fin on the substrate entirely formed with a same material as the substrate, and an isolation region on opposite sides of the at least one semiconductor fin;
   implanting ions into the substrate structure to form a doped region in the at least one semiconductor fin and in the isolation region;
   etching back the isolation region to expose a portion of the at least one semiconductor fin; and
   after the isolation region has been etched back, performing an annealing process to activate the implanted ions in the doped region,
   wherein providing the substrate structure comprises:
   providing an initial substrate;
   forming a patterned hardmask on the initial substrate;
   etching the initial substrate using the patterned hardmask as a mask to form the substrate, the at least one semiconductor fin, and a recess on the opposite sides of the at least one semiconductor fin;
   depositing an isolation material filing the recess and covering the hardmask;
   planarizing the isolation material in the recess so that the upper surface of isolation material is substantially flush with the upper surface of the hardmask;
   etching back the planarized isolation material to expose a side surface of the hardmask; and
   removing the hardmask to form the substrate structure.

2. The method of claim 1, wherein etching back the planarized isolation material comprises:
    removing a portion of the isolation material so that a remaining portion of the isolation material forms the isolation region.

3. The method of claim 1, wherein the etched-back isolation region has an upper surface higher than an upper surface of the doped region.

4. The method of claim 1, further comprising, prior to implanting ions into the substrate structure, forming a silicon oxide layer on the substrate structure.

5. The method of claim 1, wherein the at least one semiconductor fin comprises a plurality of semiconductor fins.

6. The method of claim 1, wherein implanting ions into the substrate structure comprises a p-type ion implantation process.

7. The method of claim 6, wherein the implanted ions comprise boron ions or boron difluoride ions.

8. The method of claim 1, wherein implanting ions into the substrate structure comprises an n-type ion implantation process.

9. The method of claim 8, wherein the implanted ions comprise arsenic ions or phosphorus ions.

10. A method for manufacturing a semiconductor device, the method comprising:
    providing a substrate structure including a substrate, at least one semiconductor fin on the substrate entirely formed with a same material as the substrate, and an isolation region on opposite sides of the at least one semiconductor fin;
    implanting ions into the substrate structure to form a doped region in the at least one semiconductor fin and in the isolation region;
    etching back the isolation region to expose a portion of the at least one semiconductor fin; and
    after the isolation region has been etched back, performing an annealing process to activate the implanted ions in the doped region,
    wherein the substrate comprises a well region having a same conductivity type as the doped region, and a dopant concentration of the well region being less than a dopant concentration of the doped region.

11. The method of claim 10, wherein providing the substrate structure comprises:
    providing an initial substrate;
    forming a patterned hardmask on the initial substrate;
    etching the initial substrate using the patterned hardmask as a mask to form the substrate, the at least one semiconductor fin, and a recess on the opposite sides of the at least one semiconductor fin;
    depositing an isolation material filing the recess and covering the hardmask;
    planarizing the isolation material in the recess so that the upper surface of isolation material is substantially flush with the upper surface of the hardmask;
    etching back the planarized isolation material to expose a side surface of the hardmask; and
    removing the hardmask to form the substrate structure.

12. The method of claim 10, wherein etching back the planarized isolation material comprises:
    removing a portion of the isolation material so that a remaining portion of the isolation material forms the isolation region.

13. The method of claim 10, wherein the etched-back isolation region has an upper surface higher than an upper surface of the doped region.

14. The method of claim 10, further comprising, prior to implanting ions into the substrate structure, forming a silicon oxide layer on the substrate structure.

15. The method of claim 10, wherein the at least one semiconductor fin comprises a plurality of semiconductor fins.

16. The method of claim 10, wherein implanting ions into the substrate structure comprises a p-type ion implantation process.

17. The method of claim 16, wherein the implanted ions comprise boron ions or boron difluoride ions.

18. The method of claim 10, wherein implanting ions into the substrate structure comprises an n-type ion implantation process.

19. The method of claim 18, wherein the implanted ions comprise arsenic ions or phosphorus ions.

\* \* \* \* \*